United States Patent [19]

Feldman et al.

[11] 4,326,805

[45] Apr. 27, 1982

[54] METHOD AND APPARATUS FOR ALIGNING MASK AND WAFER MEMBERS

[75] Inventors: Martin Feldman, New Providence; Alan D. White, Berkeley Heights; Donald L. White, Bernardsville, all of N.J.

[73] Assignee: Bell Telephone Laboratories, Incorporated, Murray Hill, N.J.

[21] Appl. No.: 139,544

[22] Filed: Apr. 11, 1980

[51] Int. Cl.³ .............................................. G01B 11/27
[52] U.S. Cl. .............................. 356/399; 350/162 ZP; 356/401
[58] Field of Search ..................... 356/399, 400, 401; 350/162 ZP; 250/492 A

[56] References Cited

U.S. PATENT DOCUMENTS

| | | | |
|---|---|---|---|
| 4,037,969 | 7/1977 | Feldman et al. | 356/400 |
| 4,127,777 | 11/1978 | Binder | 356/400 |
| 4,153,371 | 5/1979 | Koizumi et al. | 356/400 |
| 4,176,281 | 11/1979 | Tischer et al. | 250/492 |
| 4,187,431 | 2/1980 | Hundt | 250/492 |

*Primary Examiner*—R. A. Rosenberger
*Attorney, Agent, or Firm*—Lucian C. Canepa

[57] ABSTRACT

Zone plate patterns (12,20,61,62) formed on spaced-apart mask and wafer members (10,60) are utilized for alignment purposes in the fabrication of integrated circuits. By providing off-axis illumination of the patterns, a significant mask-to-wafer alignment capability is provided in an X-ray lithographic system. This capability includes being able to correct for so-called magnification errors that arise from physical distortions in the mask and/or wafer or in other components of the system. These errors are compensated for by utilizing the zone plate patterns to form alignment marks that serve as a basis for adjusting the mask-to-wafer separation.

7 Claims, 7 Drawing Figures

METHOD AND APPARATUS FOR ALIGNING MASK AND WAFER MEMBERS

BACKGROUND OF THE INVENTION

This invention relates to the fabrication of integrated circuits and, more particularly, to techniques for precisely aligning mask and wafer members utilized in making such circuits.

The fabrication of microminiature devices and circuits often requires that each of a set of masks (sometimes as many as 10 to 12) be successively aligned with respect to a semiconductor wafer. To obtain reasonable yields in the manufacture of such devices, precise tolerances are required in the alignment process. For very-high-resolution devices, sub-micron alignment tolerances are often necessary. In practice, the problem of devising satisfactory instrumentalities for achieving such highly precise alignment has been a difficult one to solve.

X-ray lithography is being increasingly recognized as an attractive approach for realizing very-high-resolution devices. But one of the several major problems faced by designers of X-ray exposure systems has been the requirement that the mask-to-wafer alignment capability thereof have a sub-micron precision. Moreover, if an optically based alignment technique is desired, designers are faced with the additional problem that the mask overlying an associated wafer in such a system is typically not highly transmissive to the light used for alignment. As a result, the brightness and contrast of the marks observed on the wafer during the alignment process are sometimes marginal in character. Furthermore, known alignment techniques are not capable of compensating for so-called magnification errors that arise in an X-ray system due to distortions in the mask and/or wafer, or due to other causes that result in mask-to-wafer spacing variations.

Accordingly, considerable effort has been directed at trying to devise an improved optical alignment technique for use in particular in an X-ray lithographic system. It was recognized that such effort, if successful, would significantly enhance the capability of the system and increase the likelihood of widespread commercial utilization thereof for fabricating very-high-resolution devices.

SUMMARY OF THE INVENTION

Hence, an object of the present invention is an improved alignment technique. More specifically, an object of this invention is an optical alignment technique especially adapted for use in X-ray lithography.

Briefly, these and other objects of the present invention are realized in a specific illustrative embodiment thereof in which zone plate marks formed on spaced-apart mask and wafer members are utilized to image alignment patterns in an X-ray lithographic system. In accordance with a feature of the invention, the marks are optically illuminated at an angle with respect to the main longitudinal axis of the system. As a result, applicants' alignment technique includes the capability to correct for so-called magnification errors that arise from physical distortions in the mask and/or wafer or from other causes. These errors are corrected for by utilizing the alignment patterns to adjust the mask-to-wafer separation to compensate for such distortions.

More specifically, the present invention comprises a method of fabricating a microminiature device in accordance with a process sequence in which a mask is to be aligned in precise spaced-apart relationship with respect to a semiconductor wafer in a lithographic system that includes a source for directing a diverging beam of X-rays at the mask. The source is located on a main longitudinal axis that is perpendicular to the mask and wafer. Each of the mask and wafer members includes two zone plate marks near the respective peripheries thereof to constitute two pairs of off-set overlapping marks. The center of each of the marks of a pair is located on a straight line that intersects the source. In accordance with the principles of the present invention, each pair of zone plate marks is illuminated with an off-axis optical beam that embodies alignment pattern information to cause reflection from the marks centered about the aforespecified straight line. Images of the alignment pattern are thereby formed by the zone plate marks centered about a line directed from the marks to the source.

BRIEF DESCRIPTION OF THE DRAWING

A complete understanding of the present invention and of the above and other features thereof may be gained from a consideration of the following detailed description presented hereinbelow in connection with the accompanying drawing, in which.

DETAILED DESCRIPTION

The use of zone plate patterns on masks and/or wafers to facilitate alignment thereof is described in U.S. Pat. No. 4,037,969, issued to M. Feldman and A. D. White. As set forth in detail therein, such a pattern functions in effect as a lens which is capable of providing a relatively high-brightness good-contrast image even under relatively low-light conditions and even if the pattern should be degraded by, for example, abrasion or dust.

In accordance with the principles of the present invention, patterns of the type described in the aforecited patent are included on mask and wafer members employed in an X-ray lithographic system. A typical such mask and wafer are shown in FIGS. 1 and 2, respectively.

Figure 1:
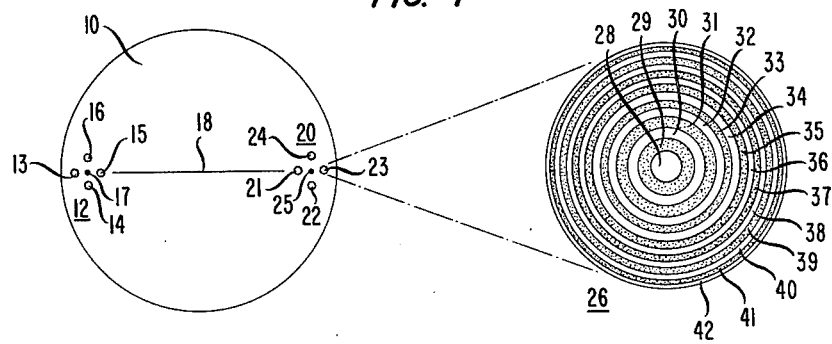
FIGS. 1 and 2 show specific illustrative zone plate marks on a mask and wafer, respectively, in accordance with one aspect of the principles of the present invention.
Figure 2:
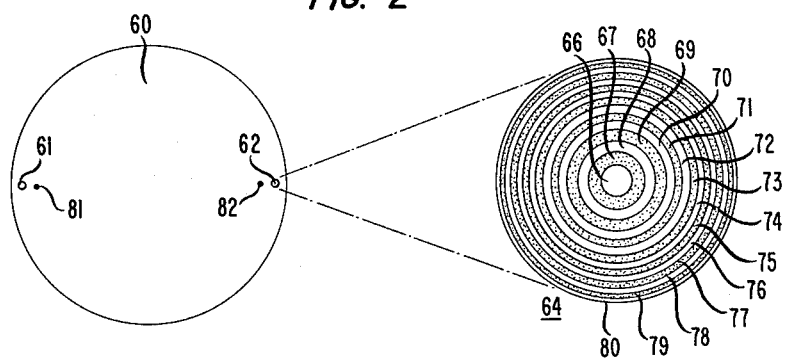

FIG. 1 is a top view of a mask 10 which comprises, for example, a substrate having a selectively patterned film of gold deposited thereon. Two groups 12 and 20 of specific illustrative alignment patterns are formed in spaced-apart peripheral portions of the mask 10 centered on x axis 18. The group 12 includes four substantially identical patterns respectively designated 13 through 16, and the group 20 includes four substantially identical patterns 21 through 24.

Illustratively, the mask 10 of FIG. 1 is approximately three inches in diameter, and the respective centers 17 and 25 of the groups 12 and 20 are each about 0.25 inches from the edge of the mask 10. By way of example, each of the patterns 13 through 16 and 21 through 24 is about 100 micrometers ($\mu m$) in diameter, and the overall diameter of each of the groups 12 and 20 is approximately 300 $\mu m$.

FIG. 1 also shows an enlargement 26 of the configuration of the mark 23. The enlarged mark 26 is diagrammatically represented as comprising an inner circle 28 surrounded by a set of concentric rings 29 through 42. The remainder of the surface of the mask 10 is patterned in a conventional manner (not shown in the drawing) to represent features of an integrated circuit to be formed in an associated semiconductor wafer.

The inner circle 28 and the rings 30, 32, 34, 36, 38, 40 and 42 of the mark 26 of FIG. 1 comprise, for example, regions of relatively high reflectivity, whereas the rings 29, 31, 33, 35, 37, 39 and 41 are designed to exhibit relatively low reflectivity. In the specific illustrative example in which the mask 10 comprises an X-ray transmissive substrate having gold patterns thereon, the areas 28, 30, 32, 34, 36, 38, 40 and 42 are made of gold and the areas 29, 31, 33, 35, 37, 39 and 41 comprise surface portions of the substrate. These surface portions exhibit relatively low reflectivity and are at least partially transmissive to the light utilized for alignment purposes. Alternatively, the areas 28, 30, 32, 34, 36, 38, 40, 42 and 29, 31, 33, 35, 37, 39, 41 may be formed to be regions of relatively low and high reflectivity, respectively.

FIG. 2 is a top view of a semiconductor wafer 60. Two specific illustrative alignment patterns 61 and 62 are formed in spaced-apart peripheral portions of the wafer 60. By way of example, the patterns 61 and 62 are each similar to the previously described marks 13 through 16 and 21 through 24 shown in FIG. 1. FIG. 2 also shows an enlargement 64 of the configuration of the mark 62. The enlarged mark 64 is diagrammatically represented as comprising an inner circle 66 surrounded by a set of concentric rings 67 through 80.

Each of the alignment patterns 61 and 62 of FIG. 2 is approximately 100 $\mu m$ in diameter. In accordance with the principles of the present invention, the patterns 61 and 62 are designed to appear slightly off-set from the respective centers of the groups 12 and 20 (FIG. 1) when the mask 10 and the wafer 60 are exactly aligned in the manner specified later below. In one specific illustrative example, the center of the pattern 61 is purposely off-set to the left by 2.54 $\mu m$ with respect to the center point 17 of the group 12, and the center of the pattern 62 is purposely off-set to the right by 2.54 $\mu m$ with respect to the center point 25 of the group 20. In FIG. 2, imaginary points 81 and 82 on the wafer 60 occur directly under the center points 17 and 25, respectively, of the mask 10 when the members 10 and 60 are exactly aligned.

Various straightforward ways of making the alignment patterns shown in FIGS. 1 and 2 are known in the art. On the wafer 60, the patterns 61 and 62 may comprise high-low reflectivity regions of the general type specified above in connection with the description of FIG. 1. Alternatively, the patterns 61 and 62 may comprise so-called phase-difference patterns characterized either by different height gradations or index of refraction differences, as specified in the Feldman-White patent.

The particular illustrative zone plate patterns shown in FIGS. 1 and 2 comprise circular Fresnel zone plates. A precise description of such a pattern and of its action as a lens are set forth in the Feldman-White patent. Herein, for illustrative purposes, the particular zone plates shown and described will be assumed to the circular Fresnel zone plates. Other types of zone plates and even patterns other than zone plates are feasible to produce focused images for alignment purposes, as specified in the cited patent. These other patterns may be substituted for the particular ones shown and described herein.

Illustratively, the zone plate marks formed on the mask 10 of FIG. 1 differ from the zone plate marks formed on the wafer 60 of FIG. 2 in the single respect that the focal lengths thereof are different. As set forth in the aforecited Feldman-White patent, zone plate marks can be designed to exhibit specified focal lengths. Herein, each of the zone plate marks 13 through 16 and 21 through 24 is designed to have a focal length $f_m$ and each of the zone plate marks 61 and 62 is designed to have a focal length $f_w$. In the illustrative embodiments specified below, $f_w$ is designed to be greater than $f_m$ by s $\mu m$ which is the nominal separation established between the mask and wafer when they are aligned for exposure in an X-ray lithographic system.

Figure 3:
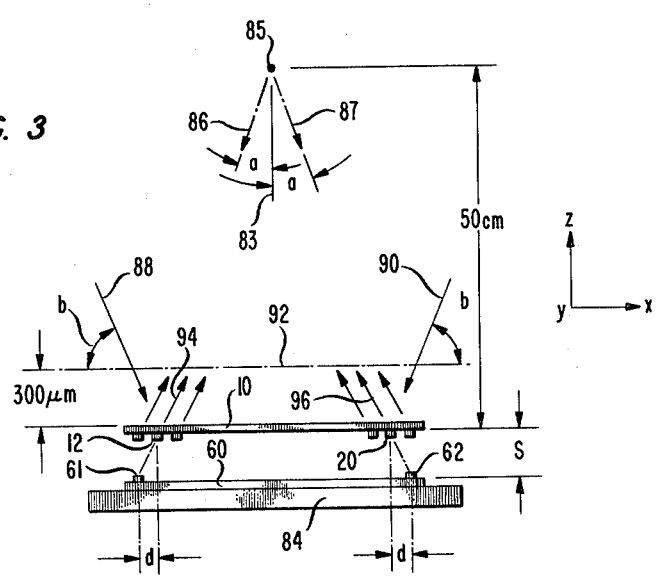
FIG. 3 shows spaced-apart mask and wafer members each having zone plate marks thereon and indicates the manner in which the marks are illuminated during alignment in accordance with this invention.

FIG. 3 shows the mask 10 of FIG. 1 and the wafer 60 of FIG. 2 positioned in spaced-apart relationship for exposure in an X-ray lithographic system. The wafer 60 is supported on a movable table 84. (A typical X-ray exposure system is described in detail in U.S. Pat. No. 4,185,202, issued to R. E. Dean, D. Maydan, J. M. Moran and G. N. Taylor.) In one particular illustrative such system, an X-ray source 85 is centrally located approximately 50 centimeters above the mask 10. A diverging beam of X-rays emanating from the source 85 is designed to flood the entire top surface of the mask 10. Rays 86 and 87 of the X-ray beam are directed at the previously specified center points 17 and 25, respectively, of the alignment mark groups 12 and 20 formed on the bottom surface of the mask 10 of FIG. 3. In the particular system assumed herein, the angle a between each of the rays 86 and 87 and main longitudinal axis 83 is approximately 3.6 degrees.

In accordance with the principles of the present invention, the rays 86 and 87 of FIG. 3 are also respectively directed at the centers of the marks 61 and 62 formed on the wafer 60. In the FIG. 3 arrangement, the off-set d between the overlapping alignment patterns on the mask and wafer is approximately 2.54 $\mu m$ when the separation s between the mask 10 and the wafer 60 is approximately 40 $\mu m$.

In accordance with a feature of this invention, each overlapping pair of zone plate patterns formed on the mask and wafer of FIG. 3 is illuminated by an off-axis optical beam emanating from a virtual source at infinity. In FIG. 3, the incident illuminating beams are centered on lines 88 and 90. The principal or chief ray from the center of each source makes an angle b with horizontal axis 92. The angle b is the complement of angle a. Accordingly, in the particular illustrative embodiment specified herein, b=96.4 degrees.

The incident beams directed along the lines 88 and 90 of FIG. 3 are focused by the zone plate marks formed on the mask 10 and the wafer 60. The focal length of each of the zone plate marks included in the group 12 and 20 on the mask 10 is designed to be approximately 300 μm, whereas the focal length of each of the marks 61 and 62 on the wafer 60 is approximately 300+s or 340 μm. Hence, images formed by all the zone plate marks are designed to occur in a common x-y plane approximately 300 μm above and parallel to the top surface of the mask 10.

In FIG. 3, the principal ray 94 of the light reflected from and focused by the zone plate mark 61 on the wafer 60 extends through the center of the group 12 on the mask 10 and is directed at the source 85. Similarly, the principal ray 96 of the light reflected from and focused by the mark 62 extends through the center of the group 20 and is also directed at the source 85. The principal rays of the reflected and focused light emanating from the four zone plate marks in the group 12 on the mask 10 each extend parallel to the ray 94. Similarly, the principal rays of the light from the marks in the group 20 each extend parallel to the ray 96.

Figure 4:
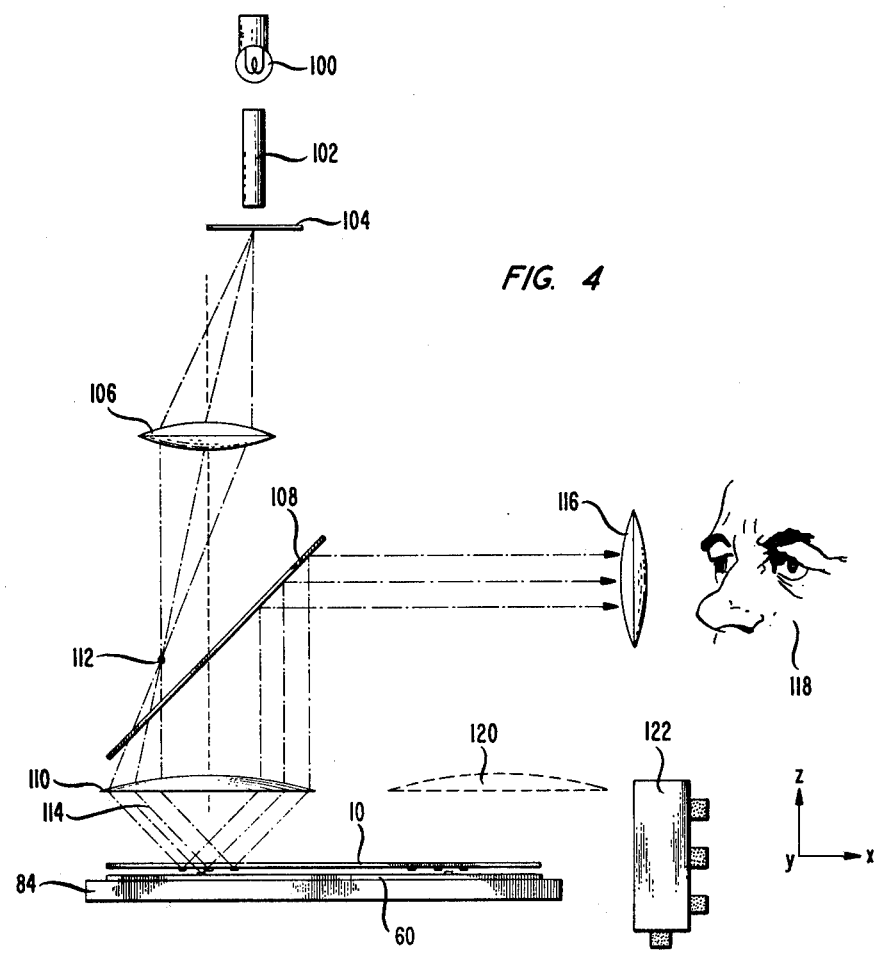
FIG. 4 is a schematic representation of a manually operated alignment system made in accordance with the principles of the present invention.
Figure 6:
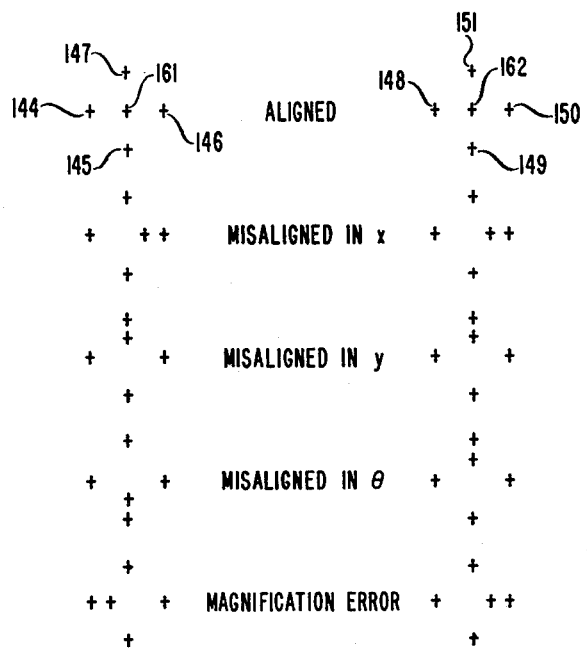
FIG. 6 shows various alignment mark patterns formed in accordance with this invention.

FIG. 4 depicts a manually operated alignment system made in accordance with the principles of the present invention. The system includes an optical source 100 which, for example, comprises a non-coherent polychromatic emitter such as a standard tungsten-halogen or mercury arc lamp. (The source 100 may also comprise a laser. An automatic alignment system including a laser light source will be described later below in connection with FIG. 7.) Illustratively, the output of the source 100 is coupled to the input end of an optical fiber 102 whose output end is positioned to illuminate a target plate 104. By way of example, the plate 104 comprises an opaque metal substrate in which a centrally positioned transparent mark is formed. Herein, the optically transparent target mark will be assumed to be a single cross. (Arrays of such crosses are shown in FIG. 6 which will be described later below.)

The system shown in FIG. 4 further includes a standard relay lens 106 and a conventional beam splitter 108. By means of the lens 106, an image of the illuminated target cross is formed centered about point 112 in the back focal plane of a conventional microscope objective 110. In turn, the objective 110 directs an optical beam from a virtual target source at infinity at the left-hand zone plate marks included on the mask 10 and the wafer 60. The off-axis orientation of the incident beam is represented by line 114 and is exactly as specified above in connection with the description of FIG. 3.

Light directed at the zone plate alignment marks represented in FIG. 4 is reflected therefrom and focused in a plane 300 μm above the mask 10. Assuming that the particular zone plate patterns shown in FIGS. 1 and 2 are formed on the mask and wafer of FIG. 4, an array of five target crosses is thereby focused in the specified plane. In turn, this array of images is directed by the objective 110, the beam splitter 108 and a standard eyepiece 116 to the eye 118 of a human operator of the depicted alignment system.

In some embodiments of the principles of the present invention, it is advantageous to include a standard optical filter in the FIG. 4 arrangement. In that way, a particular wavelength matched to the design of the zone plate marks and selected to provide relatively high intensity alignment patterns may be selected. But, even without such a filter, satisfactory performance utilizing a polychromatic light source has been realized. This is so because of several factors that in effect combine to provide a filtering action. First, the human eye exhibits a peaked response over a relatively narrow band of frequencies. Second, the various particular materials out of which the mask and wafer members are made have in practice been observed to attenuate shorter wavelengths. Moreover, only a dominant wavelength is typically in sharp focus in the particular target image plane observed by the operator.

Another alignment channel identical to the one described above is included in the FIG. 4 arrangement for illuminating the right-hand zone plate marks included on the mask 10 and the wafer 60. So as not to unduly clutter the drawing, however, only a dashed-line outline of a microscope objective 120 included in the other channel is shown in FIG. 4. This other channel provides another array of five target crosses focused in the aforespecified plane.

By observing the two arrays of target crosses provided by the FIG. 4 system, an operator is able to accurately align the mask 10 and the wafer 60 with respect to each other. Alignment is accomplished by means of a manually operated micropositioner 122. By means of the micropositioner 122, an operator can move the wafer 60 in the x and y directions. In addition, the table 84 carrying the wafer 60 can be moved by the micropositioner 122 in the z direction to adjust the mask-to-wafer separation. Further, the wafer 60 can be thereby rotated in an x-y plane about a z-parallel axis to attain a specified so-called θ alignment.

As is well known, a geometric distortion or magnification (so-called run-out) occurs in an X-ray lithographic system. This stems from the fact that in such a system a diverging X-ray beam is directed at spaced-apart mask and wafer members. This magnification effect is exactly calculable and, so long as the location of the source, the mask-to-wafer gap, and the physical sizes of the mask and wafer remain invariant, does not in itself present a problem. But, in practice, physical distortions or variations from prescribed dimensions occur in the sizes of the masks and wafers and in other components of the exposure system. Unless the mask-to-wafer gap is adjusted to compensate for such distortions or variations, a multiple mask superposition problem will occur. Heretofore, however, an optical alignment technique having the capability to perform such a compensating gap adjustment has not been available.

Figure 5:
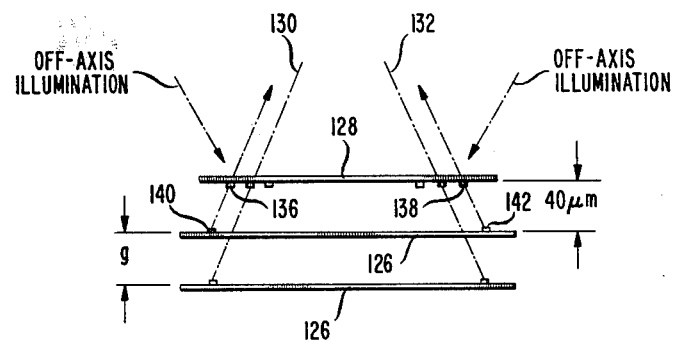
FIG. 5 depicts a mask associated with a physically distorted wafer and illustrates the occurrence and correction of so-called magnification errors.

In FIG. 5, an oversize wafer 126 is shown spaced apart from a normal-size mask 128. The separation therebetween is the aforespecified 40-μm gap distance. Lines 130 and 132 in FIG. 5 each emanate from a centrally positioned X-ray source 134 and extend through the respective centers of two zone plate patterns 136 and 138 formed on the lower surface of the mask 128. But, due to expansion of the wafer 126 from its prescribed nominal size, zone plate patterns 140 and 142 thereon as well as other features previously defined on the wafer 126 are improperly registered with respect to features on the mask 128. As a result, errors would occur if exposure of the mask 128 and the oversize wafer 126 were carried out at a gap distance of 40 μm.

In accordance with the principles of the present invention, off-axis illumination of the zone plate patterns 136, 138, 140 and 142 shown in FIG. 5 is effective to provide target images indicative of the error condition that would result if the mask 128 and the wafer 126 remained spaced apart by 40 μm. As indicated in FIG. 5, off-axis illumination of the zone plate marks 140 and 142 results in target crosses appearing to the left and to the right, respectively, of where they would appear if the wafer 126 were not oversize. (This error condition is represented in the bottom row of FIG. 6.)

In accordance with this invention, a basis is provided for adjusting the mask-to-wafer separation to compensate in effect for the error arising from the oversize wafer 126 shown in FIG. 5. By moving the wafer away from the mask 128 by an additional distance g (see FIG. 5), the desired registration between previously defined features on the wafer and new features to be defined thereon (as specified by the mask 128) is reestablished. Attainment of the appropriate mask-to-wafer separation to achieve exact registration is indicated when the target crosses focused by the zone plate marks 140 and 142 on the wafer appear centered within the respective arrays of crosses focused by the zone plate arrays 136 and 138 on the mask 128, as represented in the top row of FIG. 6.

The two target cross arrays shown in the top row of FIG. 6 are representative of spaced-apart mask and wafer members of the particular type specified herein which are aligned in x, y, z and $\theta$. Illustratively, the crosses 144 through 151 shown in FIG. 6 constitute images formed by the individual zone plate marks 13 through 16 and 21 through 24, respectively, shown on the mask 10 of FIG. 1. The centrally disposed crosses 161 and 162 shown in the top row of FIG. 6 are target images formed by the zone plate marks 61 and 62 on the wafer 60 of FIG. 2.

The target cross arrays shown in the second, third and fourth rows of FIG. 6 are respectively representative of spaced-apart mask and wafer members that are misaligned in x, y, and $\theta$. Additionally, the array shown in the last row of FIG. 6 is representative of an error condition arising from an oversize or undersize mask and/or wafer. By observing these arrays and manipulating the micropositioner 122 (FIG. 4), an operator is able to align the mask and wafer members to achieve a desired orientation therebetween.

Figure 7:
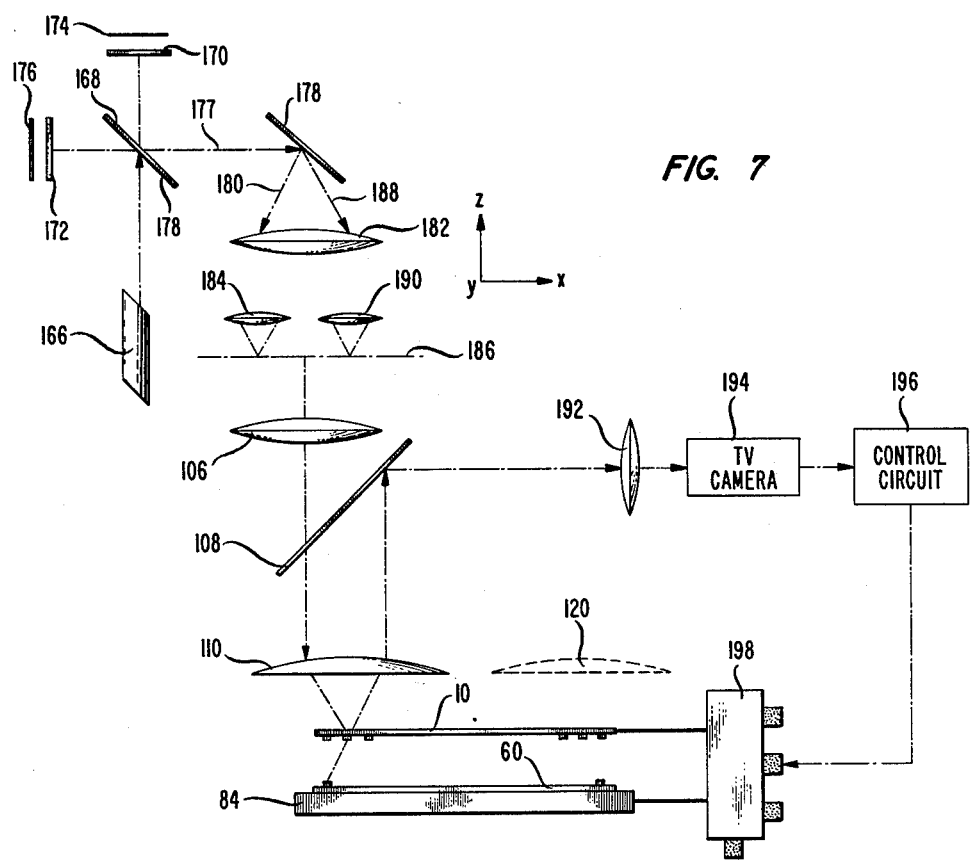
FIG. 7 is a schematic representation of an automatic alignment system made in accordance with the principles of the present invention.

An automatic alignment system made in accordance with the principles of the present invention is shown in FIG. 7. In such a system, it is advantageous to utilize a laser 166 as the light source therein. In that way, a relatively high signal-to-noise ratio is realized in the system.

To avoid interference effects in the FIG. 7 system, it is advantageous to process the single-spot output of the laser 166 to form a four-spot target array consisting of two serially occurring pairs of spots. In each pair, the spots are differently polarized. Thus, for example, assume that the output of the laser 166 is focused to form a single 45-degree-polarized light spot. This spot is directed into a standard polarizing beam splitter 168 which propagates light both upward and to the left through quarter-wave plates 170 and 172, respectively, to respectively impinge on mirrors 174 and 176. Light reflected from the mirrors is redirected through the plates 170 and 172 and then directed by the beam splitter 168 to traverse path 177 to impinge upon a galvanometer mirror 178 which is designed to rotate about a y-direction axis.

By positioning one of the mirrors 174 and 176 of FIG. 7 several degrees off orthogonality with respect to the other mirror, two spatially separated spots are propagated along the path 177. Illustratively, one spot is horizontally plane polarized and the other one is vertically plane polarized. These spots impinge upon the mirror 178 at spaced-apart locations along the y axis and are reflected to propagate along path 180. After traversing lenses 182 and 184, these spots are imaged at the same x-axis position at spaced-apart locations along the y axis either side of reference line 186.

Subsequently, the mirror 178 is rotated to cause the two spots reflected therefrom to traverse path 188, the lens 182 and lens 190. As before, these spots are imaged at spaced-apart locations along the y axis either side of reference line 186 but at a different x-axis position. Illustratively, the mirror 179 is moved between the two specified positions at a rate of about 30 rotations per second.

In the particular illustrative manner specified above and depicted in FIG. 7, a four-spot target array is thereby generated. This array is a substitute for the single target cross described above in connection with the system of FIG. 4.

The relay lens 106, the beam splitter 108 and the microscope objective 110 of FIG. 7 correspond to the identically numbered elements in FIG. 4. Similarly, the mask 10 and the wafer 60 on the movable table 84 may be identical to the previously described mask and wafer members. Zone plate marks on the members serve to focus the incident spot array above the surface of the mask 10. Thereafter, the spots are directed by the objective 110 and the beam splitter 108 to lens 192 which focuses the spots onto the face of a standard photosensitive detector such as a television camera 194. In response thereto, the camera 194 generates electrical signals representative of the incident array of optical spots. For error conditions corresponding to misalignment in x, y, or $\theta$ or arising from a distortion or size variation in the mask and/or wafer, electrical correction signals are generated by standard control circuit 196 and applied to micropositioner unit 198. In turn, the unit 198 adjusts the x, y, $\theta$ alignment and the gap separation of the depicted mask and wafer members to cause a symmetrical pattern to be incident on the camera 194. Such a pattern is representative of exact alignment between the members. At that point, no more correction signals are generated by the control circuit 196 and applied to the micropositioner 198. Consequently, no further movements of the aligned mask and wafer members occur.

Finally, it is to be understood that the above-described procedures and implementations are only illustrative of the principles of the present invention. In accordance with these principles, numerous modifications and alternatives may be devised by those skilled in the art without departing from the spirit and scope of the invention.

We claim:
1. In the fabrication of integrated circuits, a method of aligning spaced-apart mask and wafer members (10,60) which are each disposed perpendicular to a main longitudinal axis (83) of a lithographic system, each of said members having formed thereon two peripheral patterns (12,20,61,62) adapted for alignment purposes, each pattern on said mask member (10) overlying a pattern on said wafer member (60) to constitute an associated pair of patterns (12,61 and 20,62), each of the patterns on said members being responsive to incident illumination that conveys alignment mark information to form a focused image of said mark at a prescribed distance from said mask member, said method being characterized by the step of illuminating each associated pair of patterns (12,61, and 20,62) on said members (10,60) with an off-axis (88,90) optical beam.

2. A method as in claim 1 wherein said system comprises an X-ray lithographic system having an X-ray source positioned above said mask member and centered on said main longitudinal axis to direct a diverging beam of X-rays at said mask member, the center of each pattern of an associated pair of patterns on said members being on a straight line that intersects said source to form an angle a with said main longitudinal axis, and wherein said beam is directed at each associated pair of patterns along an axis that forms said same angle a with said main longitudinal axis, whereby, when said members are aligned, incident light reflected and focused by each associated pair of patterns is imaged above said mask member centered about the straight line extending to said source.

3. A method as in claim 2 wherein said illuminating beam emanates from a non-coherent polychromatic source.

4. A method as in claim 2 wherein said illuminating beam emanates from a laser source.

5. In the fabrication of integrated circuits, a method for aligning a mask member in spaced-apart relationship with respect to a semiconductor wafer member in a lithographic system that includes a source for directing a diverging beam of X-rays at said mask member, said source being located above the top surface of said mask member on a main longitudinal axis that is perpendicular to said members, each of said members having patterns thereon that when illuminated by incident optical radiation form respective focused images at prescribed distances from said members, each of said members having at least two such patterns thereon near the respective peripheries thereof to constitute two pairs of off-set overlapping patterns, the center of each of the patterns of a pair being located on a straight line that intersects said source, said method comprising the step of illuminating each pair of patterns with an off-axis optical beam from a distant virtual source conveying alignment mark information to cause reflection from said patterns along said straight line to form images of alignment marks above the top surface of said mask member.

6. Apparatus for fabricating an integrated circuit by aligning a mask member in spaced-apart relationship with respect to a semiconductor wafer member, said apparatus including a centrally positioned main longitudinal axis perpendicular to said members, said members each including on spaced-apart peripheral surface portions thereof at least two patterns that, when illuminated by incident radiation that conveys alignment mark information, focuses said radiation to form respective images of said alignment mark, each pattern on said mask member being associated with a pattern on said wafer member, each pair of associated patterns being positioned in an overlapping off-set relationship when viewed along an axis parallel to said main axis, said apparatus comprising adjustable means for supporting said members in a spaced-apart relationship, and means for illuminating each pair of patterns with an off-axis radiant beam embodying alignment mark information to form an array of focused images of said alignment mark, said array being representative of the relative alignment of and separation between said members.

7. An apparatus as in claim 6 further including means responsive to said array of images for controlling said adjustable means to vary the relative positions of said members until said images are detected to constitute a predetermined array.

* * * * *

UNITED STATES PATENT AND TRADEMARK OFFICE
CERTIFICATE OF CORRECTION

PATENT NO. : 4,326,805

DATED : April 27, 1982

INVENTOR(S) : Martin Feldman, Alan D. White and Donald L. White

It is certified that error appears in the above—identified patent and that said Letters Patent is hereby corrected as shown below:

Column 4, line 66, "96.4" should read --86.4--.

Signed and Sealed this

Seventh Day of September 1982

[SEAL]

Attest:

GERALD J. MOSSINGHOFF

*Attesting Officer*  *Commissioner of Patents and Trademarks*